United States Patent
Choy et al.

(10) Patent No.: US 7,471,582 B2
(45) Date of Patent: Dec. 30, 2008

(54) MEMORY CIRCUIT USING A REFERENCE FOR SENSING

(75) Inventors: Jon S. Choy, Austin, TX (US); Tahmina Akhter, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 100 days.

(21) Appl. No.: 11/460,745

(22) Filed: Jul. 28, 2006

(65) Prior Publication Data

US 2008/0025111 A1    Jan. 31, 2008

(51) Int. Cl.
*G11C 7/04* (2006.01)
(52) U.S. Cl. .............. 365/211; 365/189.07; 365/189.09
(58) Field of Classification Search .......... 365/211, 365/189.07, 189.09, 225.6
See application file for complete search history.

(56) References Cited

U.S. PATENT DOCUMENTS 6,697,283 B2    2/2004   Marotta et al.
2004/0062085 A1*  4/2004   Wang et al. ............ 365/189.01
2005/0078537 A1*  4/2005   So et al. ................ 365/211
2007/0171708 A1*  7/2007   Tedrow et al. ......... 365/185.03

\* cited by examiner

*Primary Examiner*—Anh Phung
*Assistant Examiner*—Toan Le
(74) *Attorney, Agent, or Firm*—James L. Clingan, Jr.; Joanna G. Chiu

(57) ABSTRACT

A memory includes a plurality of memory cells, a sense amplifier coupled to at least one of the plurality of memory cells, a temperature dependent current generator comprising a plurality of selectable temperature dependent current sources for generating a temperature dependent current, a temperature independent current generator comprising a plurality of selectable temperature independent current sources for generating a temperature independent current, and a summer coupled to the temperature dependent current generator and the temperature independent current generator for combining the temperature dependent current and the temperature independent current to generate a reference current for use by the sense amplifier. A temperature coefficient of the reference current is approximately a same as a temperature coefficient of a memory cell current of at least one of the plurality of memory cells.

14 Claims, 3 Drawing Sheets

MEMORY CIRCUIT USING A REFERENCE FOR SENSING

FIELD OF THE INVENTION

This invention relates to memory circuits, and more particularly, to sensing the logic state of memory cells in a memory circuit using a reference.

BACKGROUND OF THE INVENTION

In nonvolatile memories (NVMs), a typical reference for sensing is based on one or more memory cells constructed in the same way as the memory cells used in an array of the memory. This is beneficial for tracking the characteristics of the memory cells of the array. One difficulty has been disturbing the state of the reference cells. The reference cells would normally be expected to be divided between programmed and erase. These programmed and erased reference cells would then be used in generating the reference. When these referenced cells are disturbed and lose electrons, the reference changes which reduces the effectiveness of the reference.

Accordingly, it is desirable to sense using a reference that is not susceptible to being disturbed.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawing.

DETAILED DESCRIPTION OF THE INVENTION

In one aspect, a memory has a sense amplifier that uses a reference generated from a combination of a temperature independent current and a temperature dependent current. The memory cells are biased in a domain in which the current increases with temperature. The temperature dependent current, in the same way, increases as the temperature increases. The temperature independent current is added to the temperature dependent current to achieve a combination current that changes at the same rate as the memory cell currents. Thus, the combination current tracks the effect of temperature on the memory cells. The combination current is scaled to achieve the desired bias level and used as a reference current for a sense amplifier used in sensing the logic state of the memory cells. This is better understood by reference to the drawings and the following description.

Figure 1:
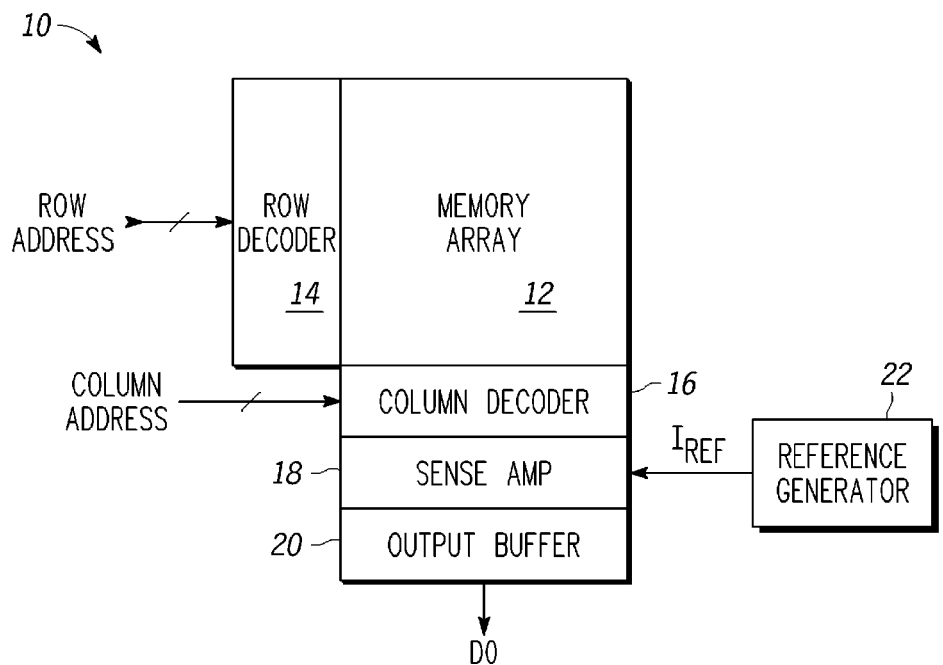
FIG. 1 is a block diagram of a memory according to an embodiment of the invention.

Shown in FIG. 1 is a memory circuit 10 comprising a memory array 12 of non-volatile memory cells, a row decoder 14 coupled to array 12 and for receiving a row address, a column decoder 16 coupled to array 12 and for receiving a column address, a sense amplifier 18 coupled to column decoder 16, an output buffer coupled to sense amplifier 18 and providing an output signal DO, and a reference generator 22 for generating a reference current Iref that is coupled to sense amplifier 18. In this example, the memory cells of array 12 are preferably floating gate memory cells, and memory 10 is a flash memory. Reference generator 22 provides reference current Iref, without requiring the use of memory cells of the type present in array 12, that tracks the memory cells of array 12 over temperature. In operation a memory cell is selected for sensing by row decoder enabling a word line selected by the row address and column decoder 16 coupling a bit line selected by the column address to sense amplifier 18. A memory cell at the intersection of the selected word line and selected bit line is sensed by sense amplifier 18. Sense amplifier 18 compares the current of the selected memory cell to the reference current Iref to determine the logic state, programmed or erased, of the selected memory cell. Output buffer 20 provides output signal at a logic state representative of the logic stated sensed by sense amplifier 18.

Figure 2:
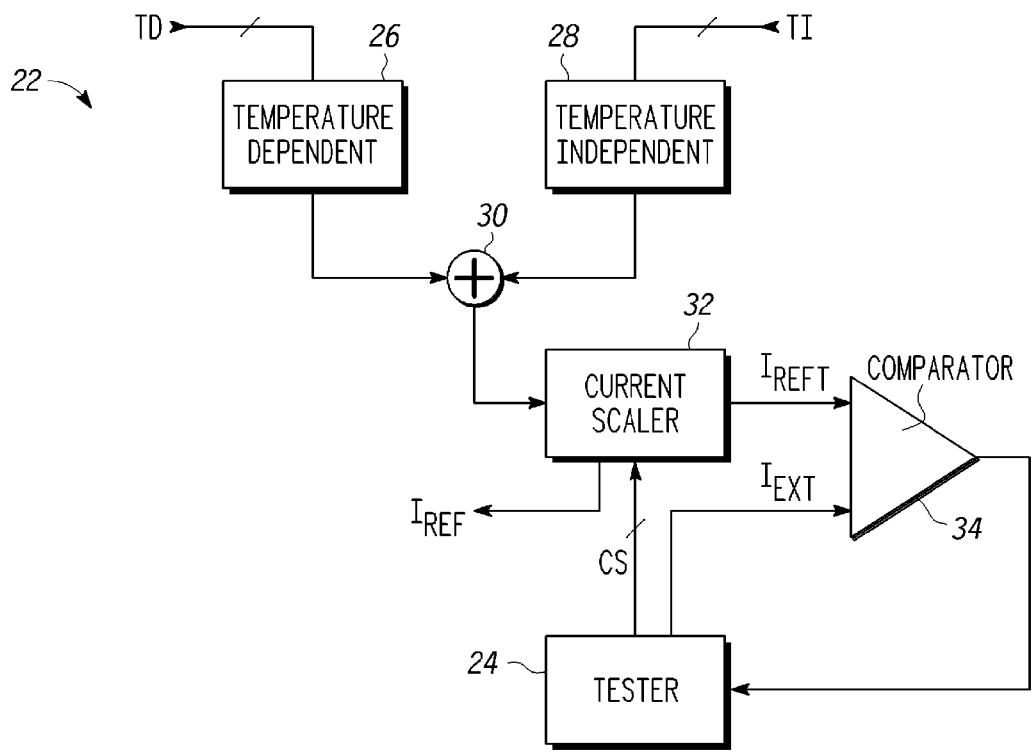
FIG. 2 is a block diagram of a portion of the memory of FIG. 1 and a tester according the embodiment of the invention.

Shown in FIG. 2 is reference generator 22 in more detail and a tester 24 which is external to the memory. Reference generator 22 comprises a temperature dependent current source (TDCS) 26 that generates an output current Itd selected by an input TD, a temperature independent current source (TICS) 28 that generates an output current Iti selected by an input Ti, a summer 30 that sums currents Itd and Iti to provide a current 130, a current scaler 32 that provides a reference current Iref as an output, provides a test reference current Ireft, and receives a current scaler signal CS that selects the scaling of current scaler 32, and a comparator 34 that receives test reference current Ireft, receives an external current Iext, and provides an output to indicate that the external current Iext and the test reference current match. Tester 24 has an input coupled to the output of comparator 34 and provides current scaler signal CS to current scaler 32. Tester 24 adjusts current scaler signal CS until external current Iext and test reference current Ireft match. Current scaler 32 provides current reference Iref to sense amplifier 18. Preferably test reference current Ireft and reference current Iref are the same magnitude or a precise multiple. Tester 24 thus sets the level of reference current Iref with external current Iext.

The chosen level for reference current Iref is preferably to be halfway between the currents of memory cells that are programmed and erased. The programming and erasing functions are performed on the basis of being some margin away from the selected bias level. Thus, a programmed cell should provide a current that is at least some predetermined amount less than the bias level. Similarly an erased cell is erased to provide a current that is at least the predetermined amount greater than the bias level.

Figure 3:
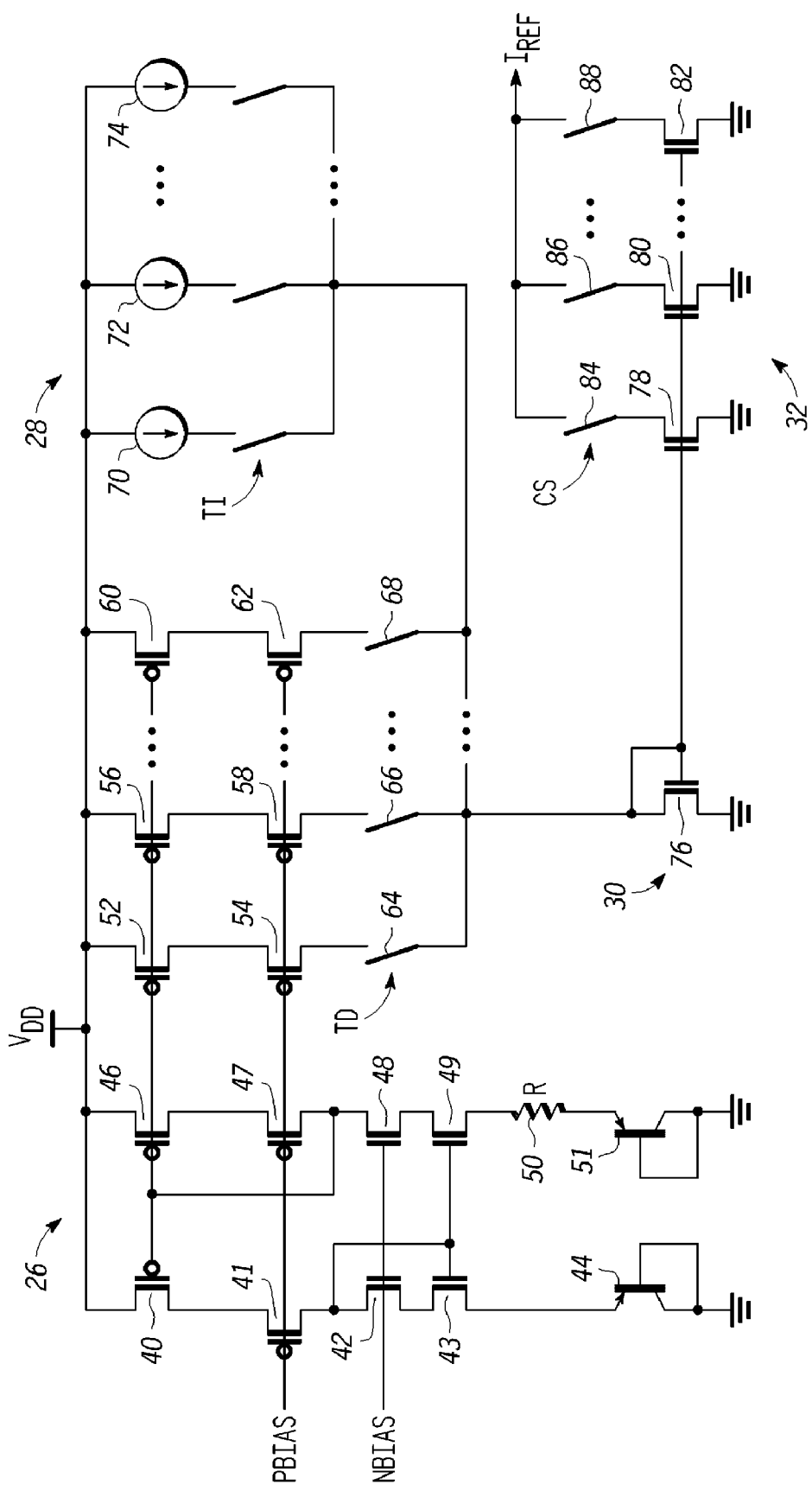
FIG. 3 is a circuit diagram of most of the portion of the memory shown in FIG. 2 according to the embodiment of the invention.

Shown in FIG. 3 are TDCS 26, TICS 28, summer 30, and a portion of current scaler 32. TDCS 26 is shown in circuit form and comprises transistors 40, 41, 42, 43, 44, 46, 47, 48, 49, 51, 52, 54, 56, 58, 60, and 62; switches 64, 66, and 68; and resistor 50. TICS 28 comprises constant current sources 70, 72, and 74 and switches controlled by signal TI. The portion of scaler 32 in FIG. 3 comprises transistors 78, 80, 82 and switches 84, 86, and 88.

With regard to TDCS 26, transistor 40, which a P channel transistor has a source connected to a positive power supply terminal, which is shown as VDD, a gate, and a drain. Transistor 41, which is P channel, has a source connected to the drain of transistor 40, a gate for receiving a bias signal Pbias, and a drain. Transistor 42, which is N channel, has a drain connected to the drain of transistor 41, a gate for receiving a bias signal Nbias, and a source. Transistor 43, which is N channel, has a drain connected to the source of transistor 42, a gate connected to the drain of transistor 42, and a source. Transistor 44, which a PNP bipolar transistor, has an emitter connected to the source of transistor 43 and a base and a collector connected to a negative power supply terminal, which is shown as ground. Transistor 46, which is P channel, has a source connected to VDD, a gate connected to the gate of transistor 40, and a drain. Transistor 47, which is P channel, has a source connected to the drain of transistor 46, a gate connected to the gate of transistor 41, and a drain. Transistor 48, which is N channel, drain connected to the drain of transistor 47, a gate connected to the gate of transistor 42, and a source. Transistor 49, which is N channel, has a drain connected to the source of transistor 48, a gate connected to the gate of transistor 43, and a source. Resistor 50 has a first terminal connected to the source of transistor 49 and a second terminal. Transistor 51, which is PNP, has an emitter connected to the second terminal of resistor 50 and a base and collector connected to ground. Transistor 52, which is P channel, has a source connected to VDD, a gate connected to the gate of transistor 46, and a drain. Transistor 54, which in P channel, has a source connected to the drain of transistor 52, a gate connected to the gate of transistor 47, and a drain. Switch 64 has a first terminal connected to the drain of transistor 54 and a second terminal connected to summer 30. Transistor 56, which is P channel, has a source connected to VDD, a gate connected to the gate of transistor 46, and a drain. Transistor 58, which P channel, has a source connected to the drain of transistor 56, and a drain. Switch 66 has a first terminal connected to the drain of transistor 58 and a second terminal connected to the second terminal of switch 64. Transistor 60, which is P channel, has a source connected to VDD, a gate connected to the gate of transistor 46, and a drain. Transistor 62, which is P channel, has a source connected to the drain of transistor 60, and a drain. Switch 68 has a first terminal connected to the drain of transistor 62 and a second terminal connected to the second terminal of switch 64.

Figure 4:
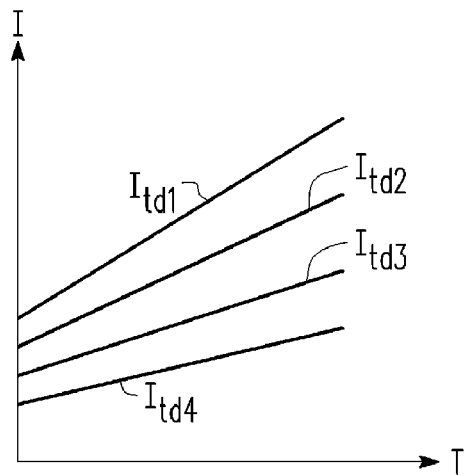
FIG. 4 is a graph showing different rates of current change relative to temperature for four different currents.

Transistors 52 and 54 and switch 64 comprise a current source that is selectable by signal TD and is temperature dependent in that the current increases with temperature. As indicated by the three dots, there may be additional current sources comprised of a pair of transistor pairs such as transistors 52 and 54 and a switch such as switch 64. PNP transistors 44 and 51 have a predetermined size ratio with transistor 51 being the larger. Typically this achieved by simply replicating the transistor. Thus for a ratio of 8, there would be 8 transistors of the same size as transistor 44 in parallel to form transistor 51. Transistors 44 and 51 are biased to have the same current, but because they are different sizes, they have a different base emitter, Vbe, drop. This differential is used to set up a bias that is temperature dependent so that currents supplied through the current sources are temperature dependent. This type of arrangement is common in a portion of a bandgap reference. Signal TD selects the current sources that are to supply the temperature dependent current to summer 30. The current sources may have different sizes as well, such as in a binary fashion. Thus each current source would supply twice as much current as the one next to it. The slope, which is rate of change, of current with respect to temperature increases with increased current being supplied. This is shown in FIG. 4 with four different currents, Itd1, Itd2, Itd3, and Itd4, being supplied by TDCS 26. In this case current Itd1 would be with the largest current being supplied and having the greatest slope; current change per temperature change. The next highest current, Itd2, has the next highest slope. Similarly, the third highest current, Itd3, has the third highest slope. Finally, the lowest current, Itd4, has the lowest slope.

With regard to TICS 28, current sources 70, 72, and 74 are selectively coupled to summer 30 by the switches controlled by signal Ti. Current sources 70, 72, and 74 are preferably bandgap references. Bandgap references are commonly used for generating references, both voltage and current, because they are considered temperature independent over relevant temperature ranges such as from −40 degrees to 125 degrees Celsius.

With regard to summer 30, transistor 76 has source connected to ground and has a drain and a gate connected to the common connection between switches 64, 68, and 68 of TDCS 26 and the switches of TICS 28. The common connection of the switches 64, 66, and 68 of TDCS 26 with the switches of TICS 28 and transistor 76 has the effect of summing the currents of TDCS 26 and TICS selected by signals TD and TI, respectively. Summer 30 provides a voltage output representative of the summation of the currents from TDCS 26 and TICS 28.

With regard to scaler 32, transistor 78 has a source connected to ground, a gate connected to the drain of transistor 76, and a drain. Switch 84 has a first terminal connected to the drain of transistor 78 and a second terminal. Transistor 80 has a source connected to ground, a gate connected to the drain of transistor 76, and a drain. Switch 86 has a first terminal connected to the drain of transistor 80 and a second terminal connected to the second terminal of switch 84. Transistor 82 has a source connected to ground, a gate connected to the drain of transistor 76, and a drain. Switch 88 has a first terminal connected to the drain of transistor 82 and a second terminal connected to the second terminal of switch 84. Each transistor/switch pair, such as transistor 78 and 84, comprise a current path selectable by signal CS. As indicated by the three dots, there may be additional current paths as well. Each current path is twice is large as one adjacent to it for convenient binary selection. The common connection of the second terminals of the switches provides reference current Iref to sense amplifier 18.

Figure 5:
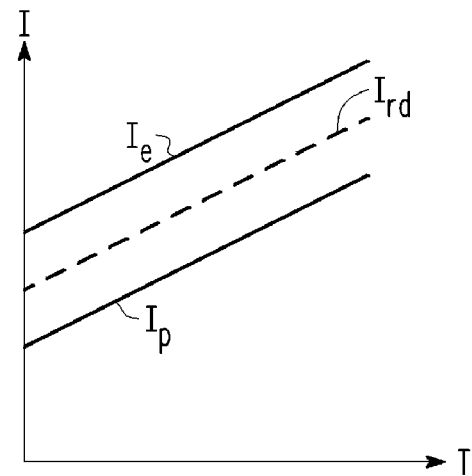
FIG. 5 is a graph showing currents for programmed and erased states relative to temperature.

Reference to FIG. 5 is helpful in showing how Iref is selected. Shown in FIG. 5 is a current Ie which is representative of the current of an erased memory cell. This current increases with temperature. Similarly, a current Ip is representative of the current of a programmed memory cell. Current Ip is lower than current Ie but both have the same slope.

Figure 6:
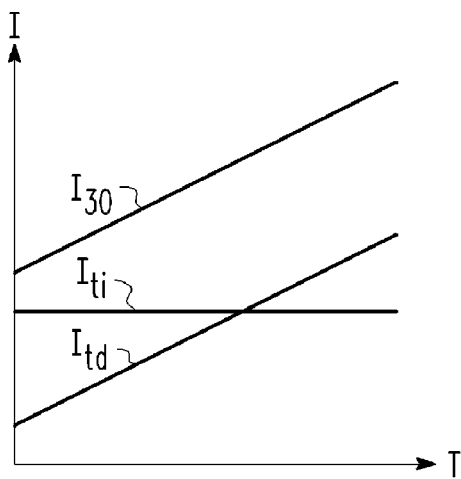
FIG. 6 is a graph showing a current resulting from summing two currents.

The slope is shown as linear which is substantially correct. There are some second order effects that are relatively small that are not shown. A desired reference current Ird is shown as being halfway between currents Ie and Ip over the relevant temperature range. This is substantially achieved by selecting a current with the same slope as currents Ie, Ip, and Ird from TDCS 26 using signal TD. This is shown as current Itd in FIG. 6. A current Iti from TICS 28 is selected by signal TI to be added to current Itd. Currents Iti and Itd are then summed by summer 30 to provide a current 130. Summer 30 actually provides a voltage representative of the summation of currents Itd and Iti. Scaler 32 converts the voltage from summer 30 to the reference current Iref at the level which is halfway between currents Ie and 10 Ip. The scaling action of scaler 32 retains the slope present in current 130 so that current Iref will match the slope of currents Ie and Ip.

The slopes of Ie and Ip are relatively fixed so that it may not be necessary to have a signal such as signal TD to select among possible Itd currents. This may be able to be a fixed circuit for providing a temperature dependent current. Similarly with TICS 28, current Iti may not need to be selectable. A fixed circuit could simply be implemented to provide a current Iti that is sufficient to ensure an adequate reference current 130 so that scaler 32 can provide the desired reference current Iref. Scaler 32 is likely to have a need to retain its ability to have selective scaling capability.

Thus, reference generator 22 is able to provide the benefit of temperature tracking while not having the susceptibility to disturb that is present with references that rely on memory cells for generating the reference. Thus, reference current Iref has a temperature coefficient to match that of currents Ie and Ip.

Various other changes and modifications to the embodiments herein chosen for purposes of illustration will readily occur to those skilled in the art. For example, the operation was described for a single memory cell but other memory cells could also be sensed by similar sense amplifiers at the same time using the same reference current. Size of a transistor refers to the channel width to channel length ratio. Although there are believed to be benefits in having the P channel to N channel ratios being as described, there may be other possibilities for these ratios that may beneficial. Switches were described which could be single transistor switches, transmission gates, or another approach. The temperature independent current source was described as being a bandgap reference but another temperature independent current source could be used. The sensing was described as requiring a current reference, but an alternative could use voltage sensing and voltage source can be easily derived from the current reference that was described. The scaler and the time independent current sources were described as being different but could be combined. To the extent that such modifications and variations do not depart from the spirit of the invention, they are intended to be included within the scope thereof which is assessed only by a fair interpretation of the following claims.

What is claimed is:

1. A memory comprising:
   a plurality of memory cells;
   a sense amplifier coupled to at least one of the plurality of memory cells;
   a reference current generator coupled to generate a reference current for the sense amplifier, the reference current generator generating a temperature dependent current and a temperature independent current, the reference current generator generating the reference current from both the temperature dependent current and the temperature independent current, wherein the reference current generator comprises a current scaler coupled to the reference current generator, the current scaler scaling the reference current to a predetermined current value; and
   a comparator coupled to the current scaler, the comparator comparing an external current to the reference current.

2. The memory of claim 1, wherein a temperature coefficient of the reference current is approximately a same as a temperature coefficient of a current of the at least one memory cell with respect to temperature.

3. The memory of claim 1, wherein the current scaler comprises a plurality of selectable temperature dependent current sources for generating the temperature dependent current.

4. The memory of claim 3, wherein a rate of change of current with respect to temperature of the temperature dependent current depends on what number of the plurality of selectable temperature dependent current sources are selected.

5. The memory of claim 3, wherein the plurality of selectable current sources comprises a first bipolar transistor and a second bipolar transistor having a different area than the first bipolar transistor.

6. The memory of claim 1, wherein the rate of change of current with respect to temperature of the temperature dependent current is approximately a same as a rate of change of current with respect to temperature of a current of the memory cell.

7. The memory of claim 1, wherein the current scaler comprises a plurality of selectable temperature independent current sources for generating the temperature independent current, wherein a level of the temperature independent current depends on what number of the plurality of selectable temperature independent current sources are selected.

8. The memory of claim 7, wherein the selectable temperature independent current sources comprises a bandgap current reference.

9. A method for generating a reference current for a memory, comprising:
   generating a temperature dependent current, the temperature dependent current having a rate of change of current with respect to temperature which represents a rate of change of current with respect to temperature of a memory cell current of the memory;
   generating a temperature independent current;
   combining the temperature dependent current and the temperature independent current to generate a reference current for use by a sense amplifier of the memory; and
   comparing the attenuated reference current to an external current to determine if the attenuated reference current matches the predetermined current value.

10. The method of claim 9, wherein the reference current has a temperature coefficient that is approximately a same as a temperature coefficient of the memory cell current.

11. The method of claim 9, further comprising:
    prior to providing the reference current for use by the sense amplifier, scaling the reference current to a predetermined current value.

12. The method of claim 9, wherein generating the temperature dependent current comprises selecting one or more selectable temperature dependent current sources to generate the temperature dependent current.

13. The method of claim 9, wherein generating the temperature independent current comprises selecting one or more selectable temperature independent current sources to generate the temperature independent current.

14. The method of claim 9, wherein the generated reference current is not generated by a reference memory cell of the memory.

* * * * *